US011729950B2

(12) United States Patent
Chehade et al.

(10) Patent No.: US 11,729,950 B2
(45) Date of Patent: Aug. 15, 2023

(54) IMMERSION COOLING SYSTEM WITH DUAL DIELECTRIC COOLING LIQUID CIRCULATION

(71) Applicant: OVH, Roubaix (FR)

(72) Inventors: Ali Chehade, Moncheaux (FR); Gregory Francis Louis Bauchart, Wattrelos (FR); Patrick-Gilles Maillot, Marsanne (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 17/691,494

(22) Filed: Mar. 10, 2022

(65) Prior Publication Data

US 2022/0322562 A1 Oct. 6, 2022

(30) Foreign Application Priority Data

Apr. 1, 2021 (EP) ..................................... 21305427
Aug. 30, 2021 (EP) ..................................... 21306174

(51) Int. Cl.
*G06F 1/16* (2006.01)
*H05K 5/00* (2006.01)
(Continued)

(52) U.S. Cl.
CPC ............ *H05K 7/203* (2013.01); *H05K 7/208* (2013.01); *H05K 7/20327* (2013.01); *H05K 7/20336* (2013.01)

(58) Field of Classification Search
CPC ............... H05K 7/203; H05K 7/20327; H05K 7/20336; H05K 7/208; H05K 7/2029
See application file for complete search history.

(56) References Cited

U.S. PATENT DOCUMENTS 2,115,501 A 4/1938 Sergius
2,316,296 A 4/1943 Simonds
(Continued)

FOREIGN PATENT DOCUMENTS

EP 2321849 A1 5/2011
EP 2331412 B1 9/2012
(Continued)

OTHER PUBLICATIONS

Extended European Search Report with regard to the counterpart EP Patent Application No. 22305018.8 completed Jun. 24, 2022.
(Continued)

*Primary Examiner* — Anthony M Haughton
(74) *Attorney, Agent, or Firm* — BCF LLP

(57) ABSTRACT

A cooling system comprises a container receiving a dielectric cooling liquid and electronic components immersed in the dielectric cooling liquid. A first pump causes a circulation of a first fraction of the dielectric cooling liquid in the container for convection cooling of the electronic components. A second pump withdraws a second fraction of the dielectric cooling liquid from the container and directs the second fraction of the dielectric cooling liquid toward the electronic components for direct cooling of the electronic components. A manifold fluidly connected to an outlet of the second pump receives the second fraction of the dielectric cooling liquid from the second pump. One or more outlet pipes fluidly connected to the manifold bring portions of the second fraction of the dielectric cooling liquid in thermal contact with the electronic components.

20 Claims, 7 Drawing Sheets

(51) Int. Cl.
    *H05K 7/00*         (2006.01)
    *H05K 7/20*         (2006.01)

(56) References Cited

U.S. PATENT DOCUMENTS

| | | | |
|---|---|---|---|
| 3,938,689 A | 2/1976 | De Munnik | |
| 4,619,316 A | 10/1986 | Nakayama et al. | |
| 5,307,956 A | 5/1994 | Richter et al. | |
| 5,907,473 A * | 5/1999 | Przilas | H05K 7/20345 174/15.1 |
| 6,023,934 A | 2/2000 | Gold | |
| 6,746,388 B2 | 6/2004 | Edwards et al. | |
| 7,403,392 B2 * | 7/2008 | Attlesey | H05K 7/20772 361/679.48 |
| 7,414,845 B2 | 8/2008 | Attlesey et al. | |
| 7,527,085 B2 | 5/2009 | Iijima et al. | |
| 7,724,517 B2 * | 5/2010 | Attlesey | G06F 1/181 361/720 |
| 7,885,070 B2 * | 2/2011 | Campbell | H05K 7/20809 361/698 |
| 7,905,106 B2 | 3/2011 | Attlesey | |
| 7,911,782 B2 | 3/2011 | Attlesey et al. | |
| 7,911,793 B2 | 3/2011 | Attlesey | |
| 8,009,419 B2 | 8/2011 | Attlesey et al. | |
| 8,014,150 B2 | 9/2011 | Campbell et al. | |
| 8,089,764 B2 | 1/2012 | Attlesey | |
| 8,089,765 B2 | 1/2012 | Attlesey | |
| 8,089,766 B2 | 1/2012 | Attlesey | |
| 8,305,759 B2 | 11/2012 | Attlesey et al. | |
| 8,467,189 B2 * | 6/2013 | Attlesey | H05K 5/067 165/80.4 |
| 8,654,529 B2 | 2/2014 | Tufty et al. | |
| 8,934,244 B2 | 1/2015 | Shelnutt et al. | |
| 9,049,800 B2 | 6/2015 | Shelnutt et al. | |
| 9,051,502 B2 | 6/2015 | Sedarous et al. | |
| 9,086,859 B2 | 7/2015 | Tufty et al. | |
| 9,128,681 B2 | 9/2015 | Tufty et al. | |
| 9,144,179 B2 | 9/2015 | Shelnutt et al. | |
| 9,155,230 B2 | 10/2015 | Eriksen | |
| 9,176,547 B2 | 11/2015 | Tufty et al. | |
| 9,195,282 B2 | 11/2015 | Shelnutt et al. | |
| 9,223,360 B2 | 12/2015 | Tufty et al. | |
| 9,328,964 B2 | 5/2016 | Shelnutt et al. | |
| 9,335,802 B2 | 5/2016 | Shelnutt et al. | |
| 9,351,429 B2 | 5/2016 | Shelnutt et al. | |
| 9,426,927 B2 | 8/2016 | Shafer et al. | |
| 9,464,854 B2 | 10/2016 | Shelnutt et al. | |
| 9,529,395 B2 | 12/2016 | Franz et al. | |
| 9,699,938 B2 | 7/2017 | Shelnutt et al. | |
| 9,699,939 B2 | 7/2017 | Smith | |
| 9,717,166 B2 | 7/2017 | Eriksen | |
| 9,756,766 B2 | 9/2017 | Best | |
| 9,773,526 B2 | 9/2017 | Shelnutt et al. | |
| 9,781,859 B1 | 10/2017 | Wishman et al. | |
| 9,795,065 B2 | 10/2017 | Shelnutt et al. | |
| 9,839,164 B2 | 12/2017 | Shelnutt et al. | |
| 9,844,166 B2 | 12/2017 | Shelnutt et al. | |
| 9,921,622 B2 | 3/2018 | Shelnutt et al. | |
| 9,968,010 B2 | 5/2018 | Shelnutt et al. | |
| 10,010,013 B2 | 6/2018 | Shelnutt et al. | |
| 10,018,425 B2 | 7/2018 | Shelnutt et al. | |
| 10,064,314 B2 | 8/2018 | Shelnutt et al. | |
| 10,143,113 B2 | 11/2018 | Shelnutt et al. | |
| 10,143,114 B2 | 11/2018 | Shelnutt et al. | |
| 10,146,231 B2 | 12/2018 | Shelnutt et al. | |
| 10,149,408 B2 | 12/2018 | Fujiwara et al. | |
| 10,156,873 B2 | 12/2018 | Shelnutt et al. | |
| 10,172,262 B2 | 1/2019 | Shelnutt et al. | |
| 10,206,312 B2 | 2/2019 | Shelnutt et al. | |
| 10,212,857 B2 | 2/2019 | Eriksen | |
| 10,225,958 B1 | 3/2019 | Gao | |
| 10,238,010 B2 | 3/2019 | Shelnutt et al. | |
| 10,321,609 B2 | 6/2019 | Hirai et al. | |
| 10,331,144 B2 | 6/2019 | Shelnutt et al. | |
| 10,399,190 B2 | 9/2019 | North et al. | |
| 10,617,042 B2 | 4/2020 | Shelnutt et al. | |
| 10,624,242 B2 | 4/2020 | Best | |
| 10,638,641 B2 | 4/2020 | Franz et al. | |
| 10,645,841 B1 | 5/2020 | Mao et al. | |
| 10,667,434 B1 | 5/2020 | Mao et al. | |
| 10,674,641 B2 | 6/2020 | Shepard et al. | |
| 10,729,039 B2 | 7/2020 | Shelnutt et al. | |
| 10,791,647 B1 | 9/2020 | Miyamura et al. | |
| 10,871,807 B2 | 12/2020 | Best et al. | |
| 10,888,032 B2 | 1/2021 | Wakino et al. | |
| 10,917,998 B2 | 2/2021 | Shelnutt et al. | |
| 10,932,390 B2 | 2/2021 | Korikawa | |
| 10,939,580 B2 | 3/2021 | Gao | |
| 10,939,581 B1 | 3/2021 | Chen et al. | |
| 10,990,144 B2 | 4/2021 | Wang et al. | |
| 11,071,238 B2 * | 7/2021 | Edmunds | H05K 7/20272 |
| 2005/0150637 A1 | 7/2005 | Tan et al. | |
| 2007/0227756 A1 | 10/2007 | Doerr et al. | |
| 2009/0260777 A1 | 10/2009 | Attlesey et al. | |
| 2010/0103620 A1 | 4/2010 | Campbell et al. | |
| 2010/0108292 A1 | 5/2010 | Bhunia et al. | |
| 2010/0118494 A1 | 5/2010 | Campbell et al. | |
| 2010/0328889 A1 * | 12/2010 | Campbell | H05K 7/20809 361/699 |
| 2011/0026776 A1 | 2/2011 | Liang et al. | |
| 2011/0028617 A1 | 2/2011 | Hill et al. | |
| 2011/0267768 A1 | 11/2011 | Attlesey | |
| 2011/0286177 A1 | 11/2011 | Attlesey | |
| 2012/0007579 A1 | 1/2012 | Apblett et al. | |
| 2012/0075797 A1 | 3/2012 | Attlesey | |
| 2013/0105120 A1 | 5/2013 | Campbell et al. | |
| 2014/0123492 A1 * | 5/2014 | Campbell | H05K 7/203 29/890.03 |
| 2015/0109730 A1 | 4/2015 | Campbell et al. | |
| 2015/0237767 A1 * | 8/2015 | Shedd | F28F 3/12 165/104.31 |
| 2015/0330718 A1 | 11/2015 | St. Rock et al. | |
| 2016/0360637 A1 | 12/2016 | Harvilchuck et al. | |
| 2017/0105313 A1 * | 4/2017 | Shedd | H05K 7/20809 |
| 2017/0127565 A1 | 5/2017 | Campbell et al. | |
| 2018/0008467 A1 | 1/2018 | Cater et al. | |
| 2018/0027695 A1 | 1/2018 | Wakino et al. | |
| 2018/0042138 A1 | 2/2018 | Campbell et al. | |
| 2018/0070477 A1 | 3/2018 | Saito | |
| 2018/0084671 A1 | 3/2018 | Matsumoto et al. | |
| 2018/0092243 A1 | 3/2018 | Saito | |
| 2018/0196484 A1 | 7/2018 | Saito | |
| 2018/0246550 A1 | 8/2018 | Inaba et al. | |
| 2018/0295745 A1 | 10/2018 | De Meijer et al. | |
| 2018/0338388 A1 | 11/2018 | We et al. | |
| 2019/0090383 A1 | 3/2019 | Tufty et al. | |
| 2019/0098796 A1 | 3/2019 | Waking et al. | |
| 2019/0297747 A1 | 9/2019 | Wakino et al. | |
| 2020/0025451 A1 | 1/2020 | Stone et al. | |
| 2020/0196489 A1 | 6/2020 | Chang et al. | |
| 2020/0214169 A1 | 7/2020 | Tsunoda | |
| 2020/0305307 A1 * | 9/2020 | Amos | H01L 23/3677 |
| 2020/0390007 A1 * | 12/2020 | Edmunds | H05K 7/20772 |
| 2021/0051815 A1 | 2/2021 | Van et al. | |
| 2021/0102294 A1 | 4/2021 | Miljkovic et al. | |
| 2021/0112683 A1 | 4/2021 | Mohajer et al. | |
| 2021/0185850 A1 | 6/2021 | Kulkarni et al. | |
| 2021/0321526 A1 | 10/2021 | Kulkarni et al. | |
| 2021/0327787 A1 | 10/2021 | Yang et al. | |
| 2021/0385971 A1 | 12/2021 | Gorius et al. | |
| 2021/0410292 A1 | 12/2021 | Yang et al. | |
| 2021/0410320 A1 | 12/2021 | Yang et al. | |
| 2021/0410328 A1 | 12/2021 | Yang et al. | |
| 2022/0256744 A1 | 8/2022 | Le et al. | |

FOREIGN PATENT DOCUMENTS

| | | |
|---|---|---|
| EP | 3236727 A2 | 10/2017 |
| EP | 3249496 A1 | 11/2017 |
| EP | 3236727 A3 | 1/2018 |
| EP | 3346491 A1 | 7/2018 |
| EP | 3742097 A1 | 11/2020 |
| EP | 2321849 B1 | 1/2022 |
| GB | 2575680 A | 1/2020 |

(56) References Cited

FOREIGN PATENT DOCUMENTS

| | | |
|---|---|---|
| JP | H043451 A | 1/1992 |
| JP | 2020065002 A | 4/2020 |
| NL | 1006486 C2 | 1/1999 |
| WO | 2011006150 A1 | 1/2011 |
| WO | 2014/169230 A1 | 10/2014 |
| WO | 2016076882 A1 | 5/2016 |
| WO | 2017/040217 A1 | 3/2017 |
| WO | 2018054462 A1 | 3/2018 |
| WO | 2019068916 A2 | 4/2019 |
| WO | 2019068916 A3 | 6/2019 |
| WO | 2020/102090 A1 | 5/2020 |
| WO | 2020170079 A1 | 8/2020 |
| WO | 2020/183038 A1 | 9/2020 |
| WO | 2020234600 A1 | 11/2020 |
| WO | 2021/040841 A1 | 3/2021 |

OTHER PUBLICATIONS

Office Action with regard to the counterpart U.S. Appl. No. 17/701,422 dated Mar. 28, 2023.
"HP Expands Workstation Series to Include Desk side, Mobile and Small Form Factor Mode", TechPowerUp, Mar. 24, 2010, https://www.techpowerup.com/118323/hp-expands-workstation-series-to-include-desk-side-mobile-and-small-form-factor-mode, retrieved on Jul. 19, 2021, 6 pages.
"IBM's Hot-Water Supercomputer Goes Live", Data Center Knowledge, retrieved on Jul. 19, 2021, 9 pages.
Extended European Search Report with regard to the EP Patent Application No. 21306771.3 completed May 23, 2022.
Extended European Search Report with regard to the EP Patent Application No. 21306173 2 completed Feb. 18, 2022.
Extended European Search Report with regard to the EP Patent Application No. 21306174 0 completed Feb. 14, 2022.
Extended European Search Report with regard to the EP Patent Application No. 21306172 4 completed Feb. 15, 2022.
English Abstract for JP2020065002 retrieved on Espacenet on Jun. 2, 2022.
Extended European Search Report with regard to the EP Patent Application No. 21306186 4 completed Feb. 10, 2022.
Extended European Search Report with regard to the EP Patent Application No. 21306187.2 completed Feb. 10, 2022.
Extended European Search Report with regard to the EP Patent Application No. 21306175.7 completed Apr. 8, 2022.
Extended European Search Report with regard to the EP Patent Application No. 21306188.0 completed Feb. 10, 2022.
English Abstract for JPH043451 retrieved on Feb. 22, 2022.
Extended European Search Report with regard to the EP Patent Application No. 21306171.6 completed Feb. 11, 2022.
Extended European Search Report with regard to the EP Patent Application No. 21306189.8 completed Feb. 10, 2022.
Extended European Search Report with regard to the EP Patent Application No. 21306170.8 completed Feb. 12, 2022.
English Abstract for NL1006486 retrieved on Espacenet on Jun. 3, 2022.
Office Action with regard to the counterpart U.S. Appl. No. 17/697,452 dated May 11, 2023.

\* cited by examiner

IMMERSION COOLING SYSTEM WITH DUAL DIELECTRIC COOLING LIQUID CIRCULATION

CROSS-REFERENCE

The present patent application claims priority from European Patent Application Number 21305427.3, filed on Apr. 1, 2021, and from European Patent Application Number 21306174.0, filed on Aug. 30, 2021, the disclosure of both of which is incorporated by reference herein in their entirety.

FIELD

The present technology relates to cooling systems for immersion cooling of electronic components. In particular, an immersion cooling system implements dual dielectric cooling liquid circulation.

BACKGROUND

Electronic equipment, for example servers, memory banks, computer discs, and the like, is conventionally grouped in equipment racks. Large data centers and other large computing facilities may contain thousands of racks supporting thousands or even tens of thousands of servers.

The racks, including equipment mounted in their backplanes, consume large amounts of electric power and generate significant amounts of heat. Cooling needs are important in such racks. Some electronic devices, such as processors, generate so much heat that they could fail within seconds in case of a lack of cooling.

Fans are commonly mounted within equipment racks to provide forced ventilation cooling to rack-mounted equipment. This solution merely displaces some of the heat generated within the racks to the general environment of the data center. Liquid cooling, in particular water cooling, has recently been introduced as an addition or replacement to traditional forced-air cooling. Cold plates, for example water blocks having internal channels for water circulation, may be mounted on heat-generating components, such as processors to displace heat from the processors toward heat exchangers. Air-to-liquid heat exchangers, for example finned tubes heat exchangers similar to radiators, may be mounted to the racks to absorb and transport some of this displaced heat toward external cooling equipment, for example cooling towers, located outside of the data center.

Immersion cooling (sometimes called immersive cooling) was more recently introduced. Electronic components are inserted in a container that is fully or partially filled with a non-conducting cooling liquid, for example an oil-based dielectric cooling liquid. Good thermal contact is obtained between the electronic components and the dielectric cooling liquid. However, an electronic component, for example a server, comprises some devices such as processors may generate most of the heat while other devices such as memory boards may generate much less heat. It is generally required to ensure circulation of the dielectric cooling liquid, within the container, at a level that is sufficient to cool the hottest devices within the electronic components. This requires the use of efficient pumps that consume a significant amount of energy. Heat sinks may be mounted on some heat-generating devices. Some other heat-generating devices may have porous surfaces so that the contact between these devices and the dielectric cooling liquid is more intimate and thus more thermally efficient. These solutions only provide a modest reduction of the amount of energy required to operate the pumps that circulation the dielectric cooling liquid within the container.

Even though the recent developments identified above may provide benefits, improvements are still desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise (1) inability to address the cooling needs to devices that generate most of the heat; and/or (2) significant power consumption of the cooling systems.

In one aspect, various implementations of the present technology provide a cooling system, comprising:

a container configured to receive a dielectric cooling liquid and to receive one or more electronic components immersed in the dielectric cooling liquid;

a first pump configured to cause a circulation of a first fraction of the dielectric cooling liquid in the container for convection cooling of the one or more electronic components;

a second pump configured to cause directing a second fraction of the dielectric cooling liquid toward at least one of the one or more electronic components for direct cooling of the at least one of the one or more electronic components;

a manifold fluidly connected to an outlet of the second pump for receiving the second fraction of the dielectric cooling liquid from the second pump; and one or more outlet pipes fluidly connected to the manifold, each outlet pipe being configured to bring a portion of the second fraction of the dielectric cooling liquid in thermal contact with a corresponding electronic component.

In some implementations of the present technology, the cooling system further comprises a first piping arrangement comprising an inlet configured to withdraw the first fraction of the dielectric cooling liquid from an upper part of the container, and an outlet fluidly connected to an inlet of the first pump; and a second piping arrangement comprising an inlet fluidly connected to an outlet of the first pump, and an outlet configured to return the first fraction of the dielectric cooling liquid to a lower part of the container.

In some implementations of the present technology, the second pump is configured to be immerged in the dielectric cooling liquid and comprises an inlet configured to withdraw the second fraction of the dielectric cooling liquid from the container.

In some implementations of the present technology, the cooling system further comprises a first piping arrangement comprising an inlet configured to withdraw the first and second fractions of the dielectric cooling liquid from an upper part of the container, and an outlet fluidly connected to an inlet of the first pump; and a second piping arrangement comprising an inlet fluidly connected to an outlet of the first pump, a first outlet configured to return the first fraction of the dielectric cooling liquid to a lower part of the container, and a second outlet configured to direct the second fraction of the dielectric cooling liquid toward an inlet of the second pump.

In some implementations of the present technology, the cooling system further comprises a heat exchanger in thermal contact with one of the first and second piping arrangements, the heat exchanger being configured to extract heat from the dielectric cooling liquid present in the one of the first and second piping arrangements, the heat exchanger being selected from an air-to-liquid heat exchanger and a liquid-to-liquid heat exchanger.

In some implementations of the present technology, the outlet pipes are not sealingly connected to the manifold.

In some implementations of the present technology, each outlet pipe is mounted to the corresponding electronic component and configured to fluidly connect to the manifold when the corresponding electronic component is inserted in the container.

In some implementations of the present technology, the first pump and the second pump are configured so that a pressure of the second fraction of the dielectric cooling liquid directed toward to the at least one of the one or more electronic components is greater than a pressure of the first fraction of the dielectric cooling liquid circulating in the container.

In some implementations of the present technology, the cooling system further comprises one or more thermal transfer devices, each thermal transfer device being adapted for mounting on a corresponding electronic component, each thermal transfer device comprising an inlet fluidly connected to the second pump via a corresponding outlet pipe and configured to receive a flow of the dielectric cooling liquid directed toward the corresponding electronic components by the second pump.

In some implementations of the present technology, the cooling system further comprises one or more thermal transfer devices, each thermal transfer device being adapted for mounting on a corresponding electronic component and for selectively receiving a flow of the dielectric cooling liquid directed toward the corresponding electronic components by the second pump, each thermal transfer device comprising an inlet fluidly connected to the second pump via a corresponding outlet pipe, and a plug formed of a phase change material having a melting temperature higher than a normal operating temperature of the cooling system and lower than a maximum safe operating temperature of the corresponding electronic component; the plug being configured to oppose the flow of the dielectric cooling liquid within the thermal transfer device when a temperature of the dielectric cooling liquid is lower than the melting temperature of the phase change material, and the plug is configured to melt and allow the flow of the dielectric cooling liquid in the thermal transfer device when a temperature of the dielectric cooling liquid exceeds the melting temperature.

In some implementations of the present technology, at least one of the thermal transfer devices comprises an outlet configured to release the flow of the dielectric cooling liquid in the container.

In some implementations of the present technology, at least one of the thermal transfer devices comprises an outlet fluidly connected to a tube configured to redirect the flow of the dielectric cooling liquid toward another component.

In some implementations of the present technology, the manifold comprises one or more apertures, each aperture being configured to fluidly connect with a corresponding one of the one or more outlet pipes.

In some implementations of the present technology, the cooling system further comprises a first sensor of a temperature of the dielectric cooling liquid; and a controller configured to receive, from the first sensor, a signal indicating a temperature of the dielectric cooling liquid, and cause an operation of the first pump in response to the temperature of the dielectric cooling liquid being greater than a first threshold.

In some implementations of the present technology, the cooling system further comprises a second sensor of a temperature of the one or more electronic components; the controller being further configured to cause an operation of the second pump in response to the temperature of the one or more electronic components being greater than a second threshold.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative systems embodying the principles of the present technology.

In an aspect, the present technology introduces a cooling system having two pumps for circulating a dielectric cooling liquid in a container that receives one or more electronic components immersed in the dielectric cooling liquid. One pump is used to cause a circulation of the dielectric cooling liquid, broadly within the container. Another pump is used to direct a flow of the dielectric cooling liquid toward the electronic components. As such, the direct flow provided enhanced cooling of specific devices of the electronic components, such as for example processors that generate the most thermal energy, while the broad circulation of the liquid cooling within the container allows cooling other devices of the electronic components while generally controlling the temperature of the dielectric cooling liquid.

Figure 1:
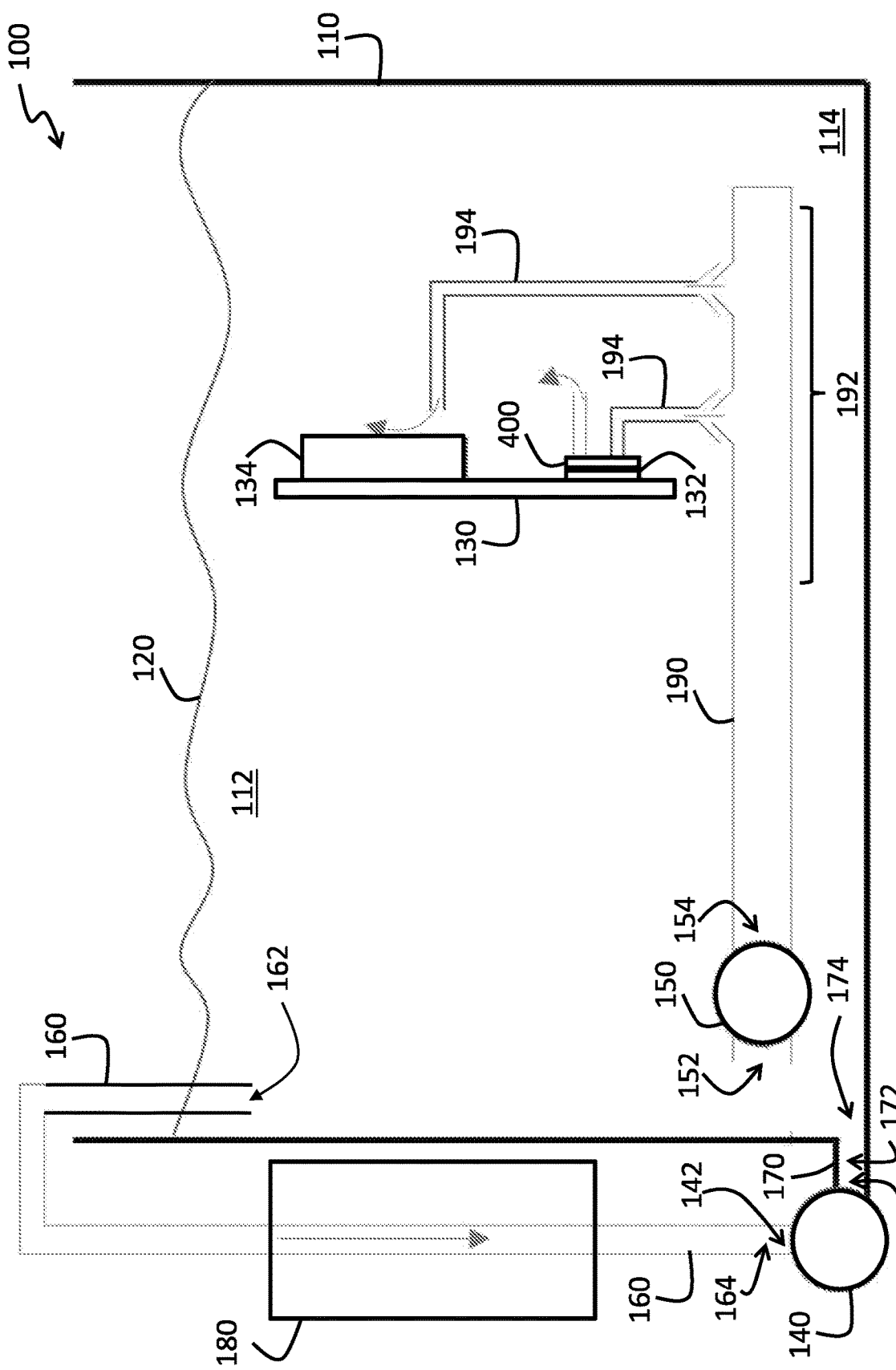
FIG. 1 is a schematic diagram of an immersion cooling system in accordance with an embodiment of the present technology.

With these fundamentals in place, we will now consider some non-limiting examples to illustrate various implementations of aspects of the present technology. FIG. 1 is a schematic diagram of an immersion cooling system 100. In the shown embodiment, the cooling system 100, comprises a container 110 configured to receive a dielectric cooling liquid 120 and to receive one or more electronic components 130 immersed in the dielectric cooling liquid 120. A pump 140 is used to cause a circulation of a first fraction of the dielectric cooling liquid 120 in the container 110 for convection cooling of the one or more electronic components 130. Another pump 150 is used to cause directing a second fraction of the dielectric cooling liquid 120 toward at least one of the one or more electronic components 130 for direct cooling of the electronic components 130. In the embodiment of FIG. 1, the pump 150 is immersed in the dielectric cooling liquid 120 and comprises an inlet 152 configured for withdrawing the second fraction of the dielectric cooling liquid 120 from the container 110. The system 100 also comprises two piping arrangements 160 and 170. The piping arrangement 160 has an inlet 162 for withdrawing the first fraction of the dielectric cooling liquid 120 from an upper part 112 of the container 110, and an outlet 164 fluidly connected to an inlet 142 of the pump 140. The piping arrangement 170 has an inlet 172 fluidly connected to an outlet 144 of the pump 140, and an outlet 174 for returning the first fraction of the dielectric cooling liquid 120 to a lower part 114 of the container 110.

As shown on FIG. 1, the cooling system 100 may comprise a heat exchanger 180 for extracting heat from the dielectric cooling liquid 120 present in the piping arrangement 160. Mounting the heat exchanger 180 on the piping arrangement 170, between the inlet 172 and the output 174, is also contemplated. Details of various embodiments of the heat exchanger 180 are provided hereinbelow.

In some embodiments, the cooling system 100 comprises one or more thermal transfer devices 400, which may also be called "cold plates" or "water blocks" (although not supplied with water in the present cooling system 100). As illustrated, a thermal transfer device 400 is mounted on a corresponding electronic component 130, more precisely on a processor 132 which is part of the electronic component 130. In various embodiments, one or more thermal transfer devices 400 may be mounted on corresponding central processing units (CPU), graphical processing units (GPU) and other heat generating devices of the electronic component 130.

Also shown on FIG. 1, the cooling system 100 also includes another piping arrangement 190 having a manifold 192 fluidly connected to an outlet 154 of the pump 150 for receiving the second fraction of the dielectric cooling from the pump 150. The piping arrangement 190 also includes one or more outlet pipes 194 fluidly connected to the manifold 192, each outlet pipe 194 being configured to bring a portion of the second fraction of the dielectric cooling liquid 120 in thermal contact with a corresponding electronic component 130. Each thermal transfer device 400 comprises an inlet 402 (FIG. 3) fluidly connected to the pump 150 via the manifold 192 and a respective outlet pipe 194 for receiving a flow of the dielectric cooling liquid 120 directed toward the corresponding electronic components 130 by the pump 150. In some embodiments, some of the outlet pipes 194 deliver at least a part of the second fraction of the dielectric cooling liquid 120 to inlets 402 of thermal transfer devices 400 directly mounted on processors 132 or like heat generating devices of the electronic components 130. In the same or other embodiments, some of the outlet pipes 194 deliver at least a part of the second fraction of the dielectric cooling liquid 120 near other devices 134 of the electronic components 130. In either cases, the second fraction of the dielectric cooling liquid 120 is then released within the container 110. The second fraction of the dielectric cooling liquid 120 having absorbed heat from the electronic components 130, its density is less than that of the remainder of the dielectric cooling liquid 120 present in the container 110 and tends to move toward the upper part 112 of the container 110, where it is likely to be picked up by the inlet 162 of the piping arrangement 160 for cooling in the heat exchanger 180 and for recirculation.

Figure 2:
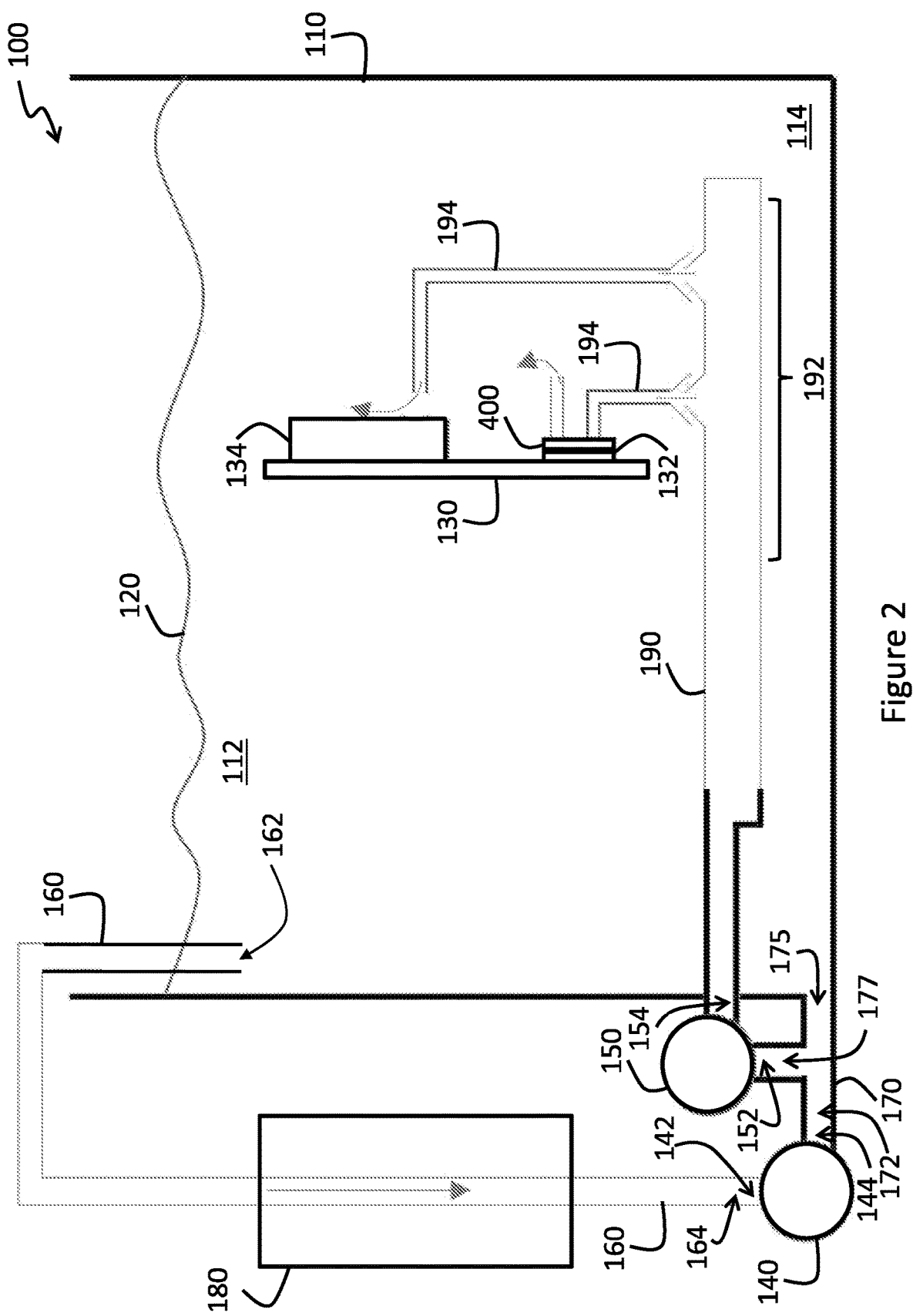
FIG. 2 is a schematic diagram of another immersion cooling system in accordance with an embodiment of the present technology.

FIG. 2 is a schematic diagram of another immersion cooling system 100. The cooling system 100 shown on FIG. 2 contains many of the components introduced in the description of FIG. 1 and a description of these components is not repeated herein. In the embodiment of FIG. 2, the pump 150 is not immersed in the dielectric cooling liquid 120. The inlet 162 of the piping arrangement 160 withdraws both the first and second fractions of the dielectric cooling liquid 120 from the upper part 112 of the container 110. A first outlet 175 of the piping arrangement 170 returns the first fraction of the dielectric cooling liquid 120 to the lower part 114 of the container 110. A second outlet 177 of the piping arrangement 170 directs the second fraction of the dielectric cooling liquid 120 toward the inlet 152 of the pump 150, which forwards the second fraction of the dielectric cooling liquid 120 toward the piping arrangement 190 via its outlet 154, as in the case of FIG. 1. It is also contemplated that the pump 150 might be connected to an independent piping arrangement (not shown) having its own inlet (not shown) for withdrawing the second fraction of the dielectric cooling liquid 120 from the upper part 112 of the container 110.

Considering FIGS. 1 and 2, in some non-limiting embodiments, the pump 140 and the pump 150 may be configured so that a pressure of the second fraction of the dielectric cooling liquid 120 directed toward the electronic components 130 is greater than a pressure of the first fraction of the dielectric cooling liquid 120 circulating in the container 110. This higher pressure provided by the pump 150 may help in overcoming the pressure drop of the dielectric cooling liquid 120 flowing in the thermal transfer devices 400. In the case of FIG. 1, flow rates of the pumps 140 and 150 are independent. However in the case of FIG. 2, the flow rate of the pump 140 is greater than the flow rate of the pump 150, so that the pump 140 may deliver both first and second fractions of the dielectric cooling liquid 120.

Figure 3:
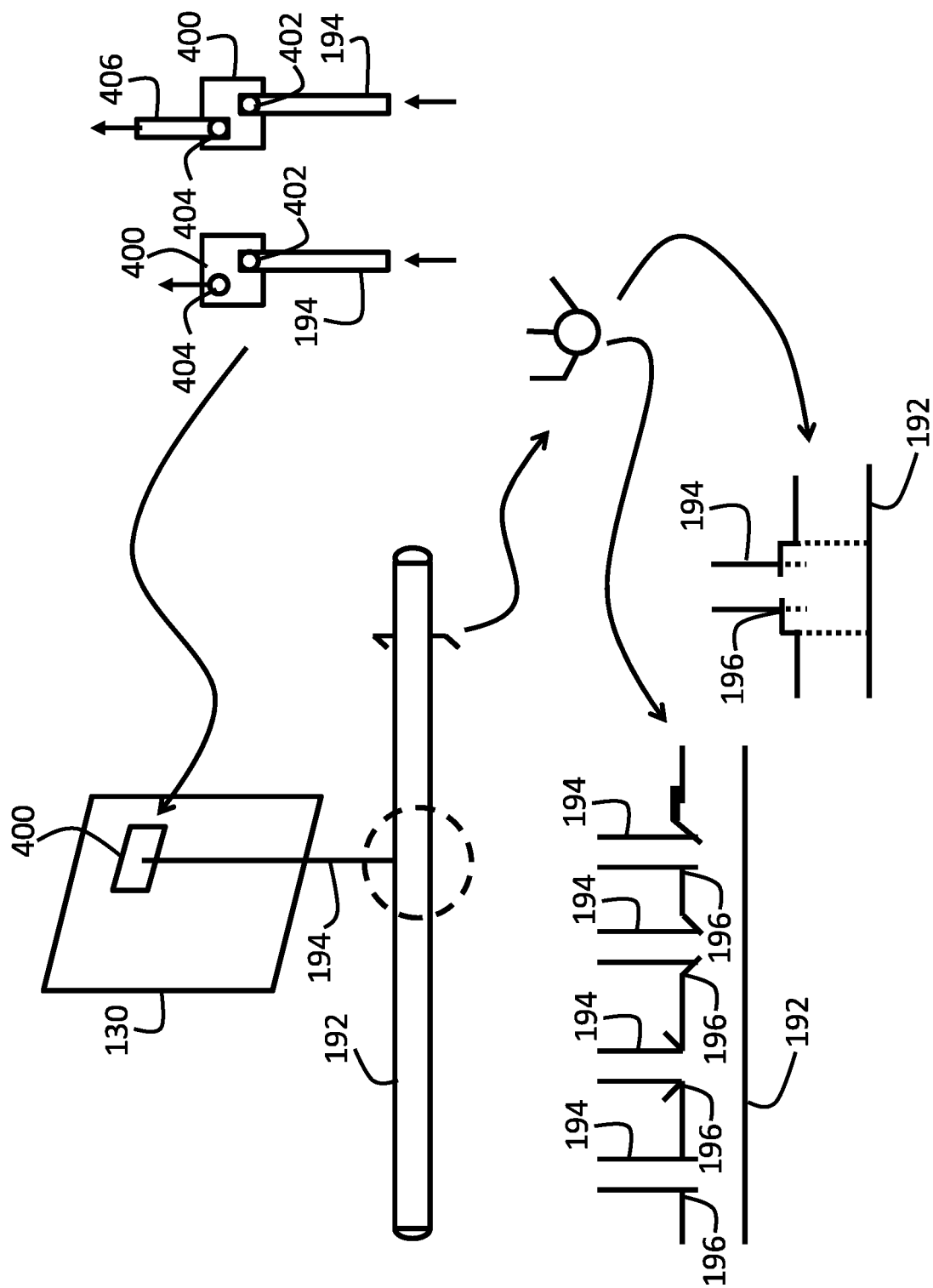
FIG. 3 illustrates various types of connections of outlet pipes between a manifold and an electronic component in accordance with an embodiment of the present technology.

Given that the same dielectric cooling liquid 120 is circulated, as a first fraction thereof, within the container 110 and, as a second fraction thereof, in the manifold 192 and toward the electronic components 130, there is no need to prevent any leakage of the dielectric cooling liquid 120 between the manifold 190 and the container 110. For example, FIG. 3 illustrates various types of connections of outlet pipes 194 between a manifold 192 and an electronic component 130. The outlet pipes 194 are not required to be sealingly connected to the manifold 192. Instead, the manifold includes a series of apertures 196, each of which is sized and positioned for receiving a lower end of a corresponding outlet pipe 194 for delivering some of the second fraction of the dielectric cooling liquid 120 toward the electronic component 130. While the apertures 196 may be dimensioned to provide a snug fit with the outlet pipes 194 received therein, some leakage of the second fraction of the dielectric cooling liquid 120 from the manifold 192 to the container 110 is acceptable, given that the container 110 is generally filled with such dielectric cooling liquid 120.

As a result, for inserting the electronic component 130 in the container 110, the thermal transfer device 400 and a corresponding outlet pipe 194 may be pre-installed on the electronic component 130, which can then be inserted in position within the container 110 so that the lower end of the outlet pipe 194 reaches a corresponding aperture 196 of the manifold 192. As such, a fluidic connection is obtained between the manifold 192 and the outlet pipes 194, without the need to use any particular type of sealable or complex connectors between the manifold 192 and the outlet pipes 194. Eventual removal of the electronic component 130 from the container 110 may be obtained without the need to disconnect any particular connector at the interface between the manifold 192 and the outlet pipes 194.

As mentioned hereinabove, each thermal transfer device 400 includes an inlet 402 fluidly connected to the pump 150 via the manifold 192 and a respective outlet pipe 194. Each thermal transfer device 400 also comprises an outlet 404 for releasing the flow of the dielectric cooling liquid 120 in the container 110. The flow of the dielectric cooling liquid 120 may be directly released in the container 110 from the outlets 404. A tube 406 may be fluidly connected to the outlet 404 of some of the thermal transfer devices 400 to redirect the flow of the dielectric cooling liquid 120 toward another component present in the container 110, for example another electronic component 130 or another heat transfer device 400.

Figure 4:
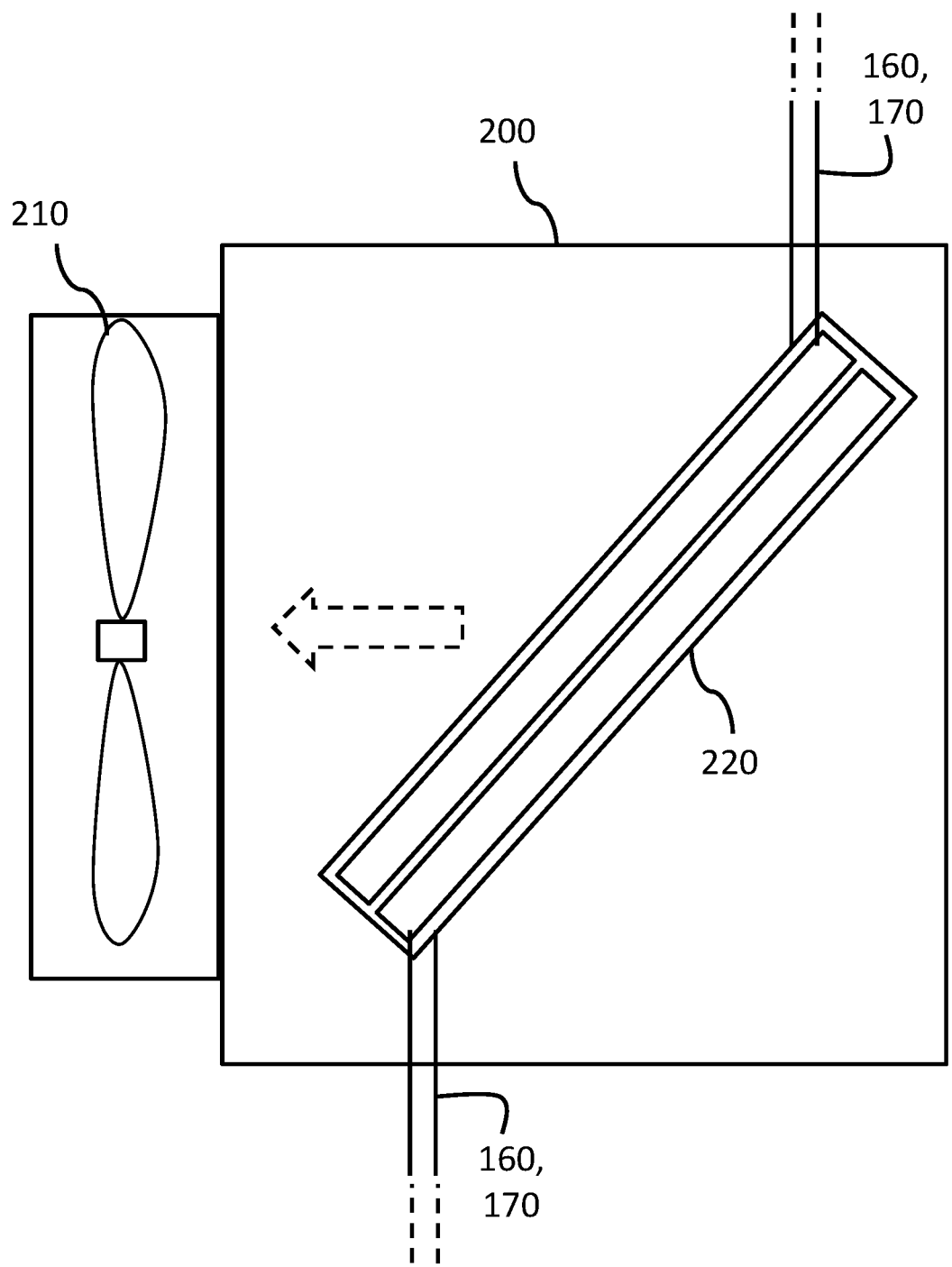
FIG. 4 is a block diagram of an air-to-liquid heat exchanger thermally connected to a piping arrangement in accordance with an embodiment of the present technology.

The heat exchanger 180 introduced in the description of FIGS. 1 and 2 may comprise an air-to-liquid heat exchanger. FIG. 4 is a block diagram of an air-to-liquid heat exchanger 200 thermally connected to the piping arrangement 600 or 700. One or more fans 210 positioned downstream (as illustrated) or upstream of the air-to-liquid heat exchanger 200 cause an airflow through the air-to-liquid heat exchanger 200, to extract heat from the dielectric cooling liquid 120 flowing through a core 220 of the air-to-liquid heat exchanger 200.

Figure 5:
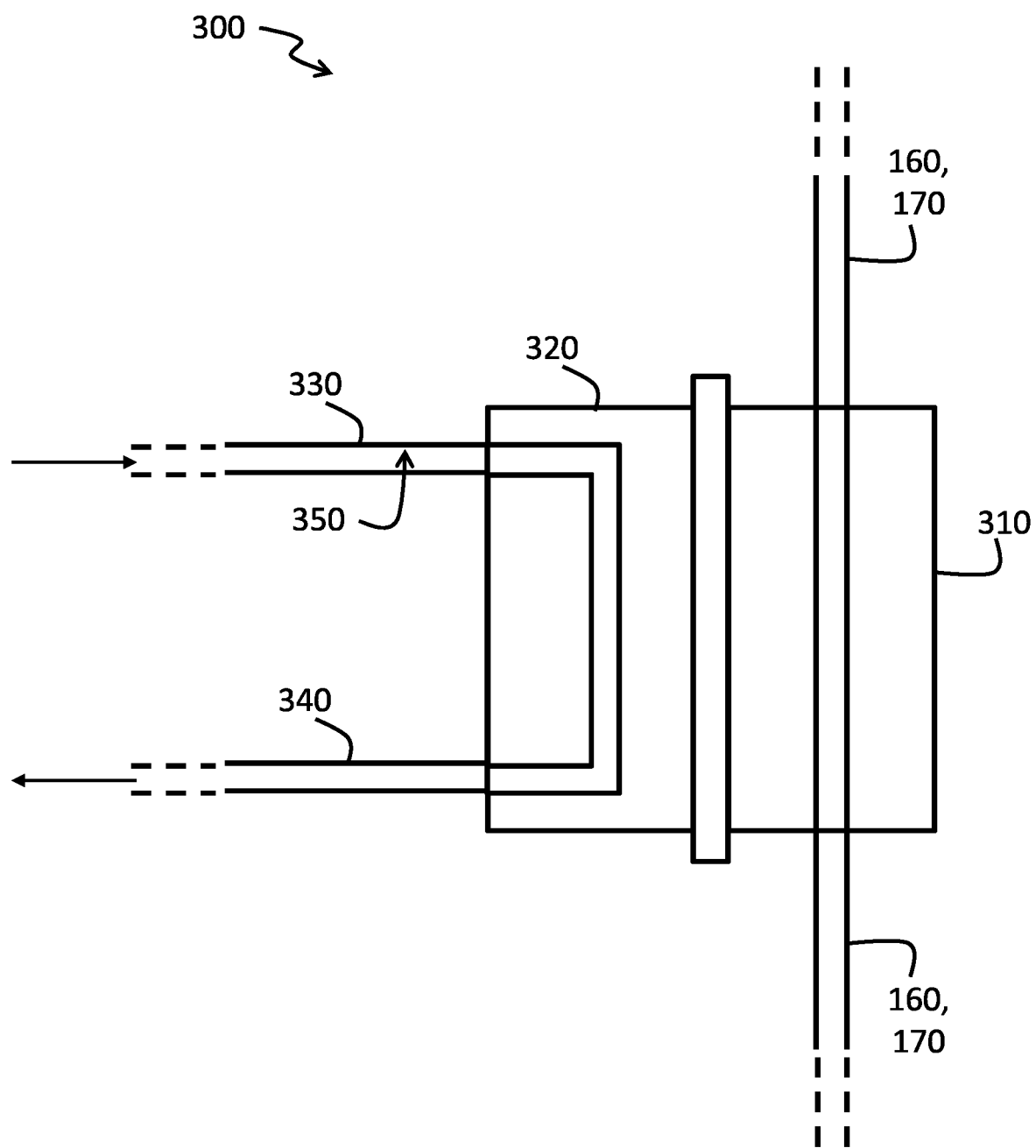
FIG. 5 is a block diagram of a liquid-to-liquid heat exchanger thermally connected to a piping arrangement in accordance with an embodiment of the present technology.

Alternatively, the heat exchanger 180 introduced in the description of FIGS. 1 and 2 may comprise a liquid-to-liquid heat exchanger. FIG. 5 is a block diagram of a liquid-to-liquid heat exchanger 300 thermally connected to the piping arrangement 600 or 700. The liquid-to-liquid heat exchanger 300 includes a primary side 310 in thermal contact with the piping arrangements 160 or 170, and a secondary side 320 in thermal contact with the primary side 310. A flow of a liquid coolant 350, for example water, is received in the secondary side 320 via a liquid coolant inlet 330 and is returned from the secondary side 320 via a liquid coolant outlet 340. The flow of a liquid coolant 350 in the secondary side 320 allows to extract heat from the dielectric cooling liquid 120 present in the piping arrangement 160 or 170. The liquid coolant inlet 330 and the liquid coolant outlet 340 are connected to an external liquid coolant source (not shown), for example an external dry cooler.

Figure 6:
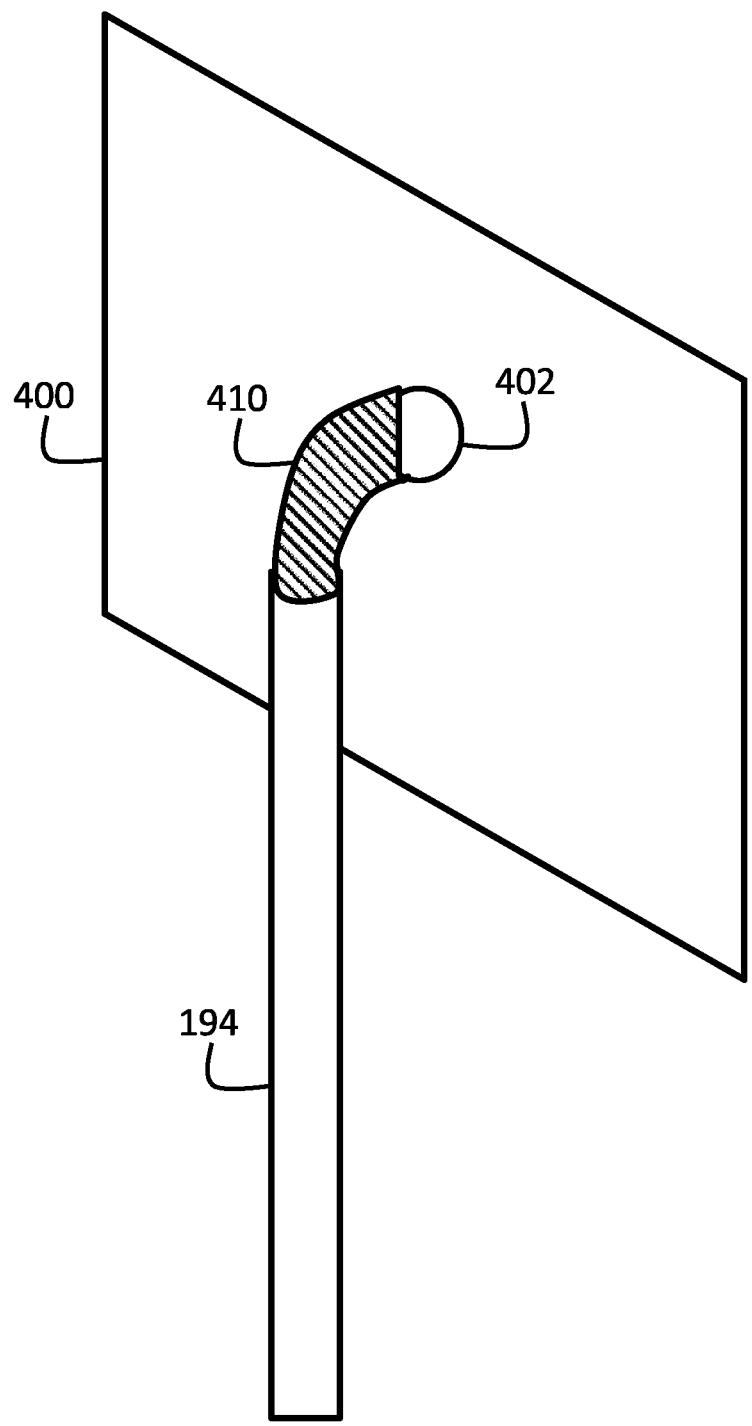
FIG. 6 is a schematic representation of a phase change material plug for selectively allowing dielectric cooling fluid to reach a thermal transfer device in accordance with an embodiment of the present technology.

In an embodiment, the flow of dielectric cooling liquid 120 to some of the thermal transfer devices 400 may be prevented until a temperature of the dielectric cooling liquid 120 in the reservoir 110 reaches an unacceptable level. FIG. 6 is a schematic representation of a phase change material (PCM) plug 410 for selectively allowing dielectric cooling fluid 120 to reach a thermal transfer device 400. One thermal transfer device 400 mounted on a corresponding electronic components 130 selectively receives a flow of the dielectric cooling liquid 120 directed toward the corresponding electronic components 130 by the pump 150. A plug 410 formed of a suitable PCM, for example wax, resin, paraffin, grease, silicone, synthetic glue and polymers, is inserted in the outlet pipe 194, for example near the inlet 402 of the thermal transfer device 400. Alternatively, the plug 410 may be formed at any point between the lower part of the outlet pipe 194 and the inlet 402 of the thermal transfer device 400, at the outlet 404 of the thermal transfer device 400, or at any point between the inlet 402 and outlet 404 of the thermal transfer device 400.

The PCM has a melting temperature higher than a normal operating temperature of the cooling system 100 and lower than a maximum safe operating temperature of the corresponding electronic component 130. In normal operation of the cooling system 100, the temperature of the dielectric cooling fluid 120 within the container 110 is lower than the melting temperature of the PCM. The plug 410 opposes the flow of the dielectric cooling liquid 120 within the thermal transfer device 400 under such condition. The plug 410 melts and allows the flow of the dielectric cooling liquid 120 in the thermal transfer device 400 when the temperature of the dielectric cooling liquid 120 exceeds the melting temperature of the PCM, in order to provide enhanced cooling of the electronic component 130.

It may be noted that, once melted, the plug 410 no longer exists and the PCM is dispersed within the dielectric cooling liquid 120. If the temperature of the dielectric cooling liquid 120 is reduced below the melting temperature of the PCM, the material of the plug 410 is expected to solidify and float in the upper part 112 of the container 110, or fall to the lower part 114 of the container, depending on its density.

Figure 7:
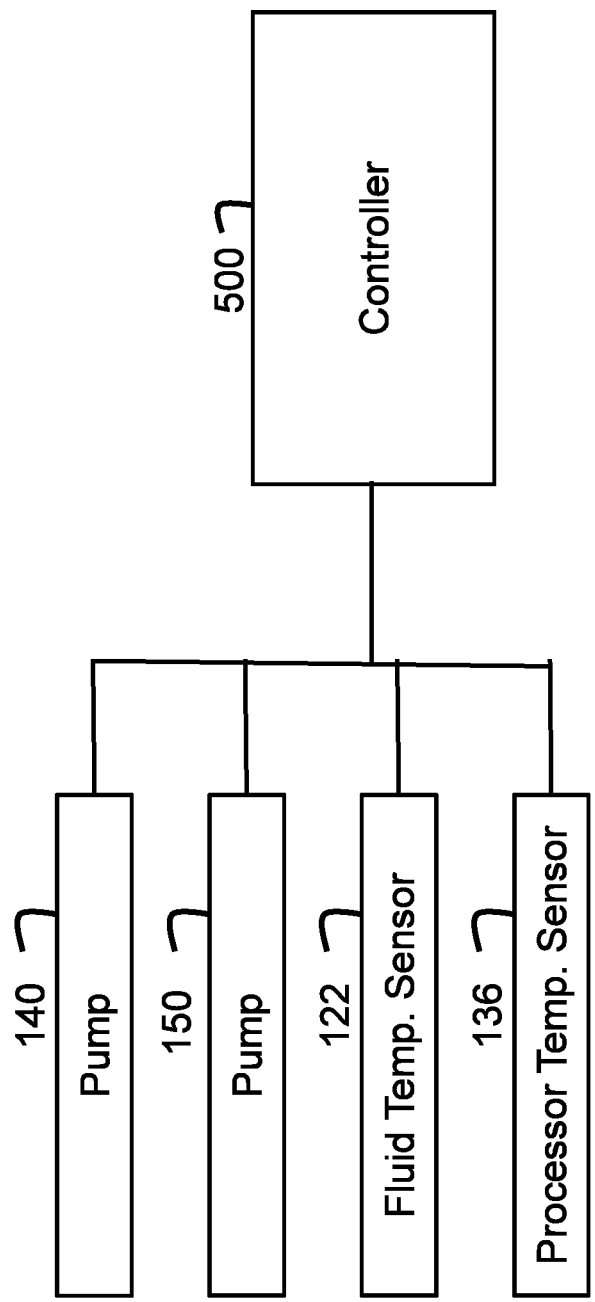
FIG. 7 is a block diagram of a system for controlling the pumps in accordance with an embodiment of the present technology.

FIG. 7 is a block diagram of a system for controlling the pumps 140 and 150. In a non-limiting embodiment, a fluid temperature sensor 122 may detect a temperature of the dielectric cooling liquid 120 in the container 110. A reading of this temperature may be provided by the fluid temperature sensor 122 to a controller 500. The controller 500 may control the operation of the pump 140 by starting the pump 140 when the temperature of the dielectric cooling liquid 120 rises above a first threshold, stopping the pump 140 when the temperature of the dielectric cooling liquid 120 falls below the first threshold. The controller 500 may implement a hysteresis so that the pump 140 is stopped when the temperature of the dielectric cooling liquid 120 falls to a temperature that is somewhat lower than the first threshold, in order to avoid frequently starting and stopping the pump 140. Use of a timer to maintain the pump 140 in operation for at least a minimum duration is also contemplated. In the same or another embodiment, a processor temperature sensor 136 may detect a temperature of the electronic component 130, for example a temperature of the processor 132. The controller 500 may control the operation of the pump 150 by starting the pump 150 when the temperature of the electronic component 130 rises above a second threshold, stopping the pump 150 when the temperature of the electronic component 130 falls below the second threshold. The controller 500 may implement a hysteresis so that the pump 150 is stopped when the temperature of the electronic component 130 falls to a temperature that is somewhat lower than the threshold, in order to avoid frequently starting and stopping the pump 150. Use of a timer to maintain the pump 150 in operation for at least a minimum duration is also contemplated. It is also contemplated that the controller 500 may start the pump 140 when the temperature of the electronic component 130 rises above the second threshold, whether the temperature of the dielectric cooling liquid 120 is above or below the first threshold, so that a circulation of the dielectric cooling liquid 120 is consistently maintained in the container 110 via the piping arrangement 160 when the temperature of the electronic component 130 reaches the second threshold and causes starting of the pump 150.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A cooling system, comprising:
    a container configured to receive a dielectric cooling liquid and to receive one or more electronic components immersed in the dielectric cooling liquid;
    a first pump configured to cause a circulation of a first fraction of the dielectric cooling liquid in the container for convection cooling of the one or more electronic components;
    a second pump configured to cause directing a second fraction of the dielectric cooling liquid toward at least one of the one or more electronic components for direct cooling of the at least one of the one or more electronic components;
    a manifold fluidly connected to an outlet of the second pump for receiving the second fraction of the dielectric cooling liquid from the second pump; and
    one or more outlet pipes fluidly connected to the manifold, each output pipe being configured to bring a portion of the second fraction of the dielectric cooling liquid in thermal contact with a corresponding electronic component.

2. The cooling system of claim 1, further comprising:
    a first piping arrangement comprising:
        an inlet configured to withdraw the first fraction of the dielectric cooling liquid from an upper part of the container, and
        an outlet fluidly connected to an inlet of the first pump; and
    a second piping arrangement comprising:
        an inlet fluidly connected to an outlet of the first pump, and
        an outlet configured to return the first fraction of the dielectric cooling liquid to a lower part of the container.

3. The cooling system of claim 2, wherein the second pump is configured to be immerged in the dielectric cooling liquid and comprises an inlet configured to withdraw the second fraction of the dielectric cooling liquid from the container.

4. The cooling system of claim 1, further comprising:
    a first piping arrangement comprising:
        an inlet configured to withdraw the first and second fractions of the dielectric cooling liquid from an upper part of the container, and
        an outlet fluidly connected to an inlet of the first pump; and a second piping arrangement comprising:
  an inlet fluidly connected to an outlet of the first pump,
  a first outlet configured to return the first fraction of the dielectric cooling liquid to a lower part of the container, and
  a second outlet configured to direct the second fraction of the dielectric cooling liquid toward an inlet of the second pump.

5. The cooling system of claim 2, further comprising a heat exchanger in thermal contact with one of the first and second piping arrangements, the heat exchanger being configured to extract heat from the dielectric cooling liquid present in the one of the first and second piping arrangements.

6. The cooling system of claim 5, wherein:
the heat exchanger is an air-to-liquid heat exchanger; and
the cooling system comprises one or more fans configured to cause an airflow through the air-to-liquid heat exchanger.

7. The cooling system of claim 5, wherein:
the heat exchanger is a liquid-to-liquid heat exchanger comprising:
  a primary side in thermal contact with the one of the first and second piping arrangements, and
  a secondary side in thermal contact with the primary side, and
  a liquid coolant inlet and a liquid coolant outlet fluidly connected to the secondary side of the liquid-to-liquid heat exchanger and configured to allow a flow of a liquid coolant in the secondary side for extracting heat from the dielectric cooling liquid present in the one of the first and second piping arrangements.

8. The cooling system of claim 1, wherein the outlet pipes are not sealingly connected to the manifold.

9. The cooling system of claim 1, wherein each outlet pipe is mounted to the corresponding electronic component and configured to fluidly connect to the manifold when the corresponding electronic component is inserted in the container.

10. The cooling system of claim 1, wherein the first pump and the second pump are configured so that a pressure of the second fraction of the dielectric cooling liquid directed toward to the at least one of the one or more electronic components is greater than a pressure of the first fraction of the dielectric cooling liquid circulating in the container.

11. The cooling system of claim 1, further comprising one or more thermal transfer devices, each thermal transfer device being adapted for mounting on a corresponding electronic component, each thermal transfer device comprising an inlet fluidly connected to the second pump via a corresponding outlet pipe and configured to receive a flow of the dielectric cooling liquid directed toward the corresponding electronic components by the second pump.

12. The cooling system of claim 1, further comprising:
one or more thermal transfer devices, each thermal transfer device being adapted for mounting on a corresponding electronic component and for selectively receiving a flow of the dielectric cooling liquid directed toward the corresponding electronic components by the second pump, each thermal transfer device comprising:
  an inlet fluidly connected to the second pump via a corresponding outlet pipe, and
  a plug formed of a phase change material having a melting temperature higher than a normal operating temperature of the cooling system and lower than a maximum safe operating temperature of the corresponding electronic component;
wherein:
  the plug is configured to oppose the flow of the dielectric cooling liquid within the thermal transfer device when a temperature of the dielectric cooling liquid is lower than the melting temperature of the phase change material, and
  the plug is configured to melt and allow the flow of the dielectric cooling liquid in the thermal transfer device when a temperature of the dielectric cooling liquid exceeds the melting temperature.

13. The cooling system of claim 11, wherein at least one of the thermal transfer devices comprises an outlet configured to release the flow of the dielectric cooling liquid in the container.

14. The cooling system of claim 11, wherein at least one of the thermal transfer devices comprises an outlet fluidly connected to a tube configured to redirect the flow of the dielectric cooling liquid toward another component.

15. The cooling system of claim 1, wherein the manifold comprises one or more apertures, each aperture being configured to fluidly connect with a corresponding one of the one or more outlet pipes.

16. The cooling system of claim 1, further comprising:
a first sensor of a temperature of the dielectric cooling liquid; and
a controller configured to:
  receive, from the first sensor, a signal indicating a temperature of the dielectric cooling liquid, and
  cause an operation of the first pump in response to the temperature of the dielectric cooling liquid being greater than a first threshold.

17. The cooling system of claim 16, further comprising:
a second sensor of a temperature of the one or more electronic components;
wherein the controller is further configured to cause an operation of the second pump in response to the temperature of the one or more electronic components being greater than a second threshold.

18. The cooling system of claim 17, wherein the controller is further configured to cause an operation of the first pump, irrespective of the temperature of the dielectric cooling liquid, in response to the temperature of the one or more electronic components being greater than the second threshold.

19. The cooling system of claim 1, further comprising:
a second sensor of a temperature of the one or more electronic components; and
a controller configured to:
  receive, from the second sensor, a signal indicating a temperature of the one or more electronic components, and
  cause an operation of the second pump in response to the temperature of the one or more electronic components being greater than a second threshold.

20. The cooling system of claim 19, wherein the controller is further configured to cause an operation of the first pump in response to the temperature of the one or more electronic components being greater than the first threshold.

* * * * *

UNITED STATES PATENT AND TRADEMARK OFFICE
CERTIFICATE OF CORRECTION

PATENT NO. : 11,729,950 B2
APPLICATION NO. : 17/691494
DATED : August 15, 2023
INVENTOR(S) : Ali Chehade et al.

It is certified that error appears in the above-identified patent and that said Letters Patent is hereby corrected as shown below:

In the Claims

Column 10, Claim 1, Lines 38-39 should read --one or more outlet pipes fluidly connected to the manifold, each outlet pipe being configured to bring a--

Column 12, Claim 20, Line 61 should read --components being greater than the second threshold.--

Signed and Sealed this
Twenty-fourth Day of October, 2023

Katherine Kelly Vidal
*Director of the United States Patent and Trademark Office*